United States Patent [19]

Russell

[11] Patent Number: 5,781,050
[45] Date of Patent: Jul. 14, 1998

[54] OPEN DRAIN OUTPUT DRIVER HAVING DIGITAL SLEW RATE CONTROL

[75] Inventor: Matthew Russell, Burnsville, Minn.

[73] Assignee: LSI Logic Corporation, Milpitas, Calif.

[21] Appl. No.: 751,086

[22] Filed: Nov. 15, 1996

[51] Int. Cl.$^6$ .............................. H03K 5/12; H03K 17/16
[52] U.S. Cl. .................. 327/170; 327/379; 327/108
[58] Field of Search ........................... 327/134, 170, 327/379, 380, 381, 108, 109, 112; 326/26, 27

[56] References Cited

U.S. PATENT DOCUMENTS

| | | | |
|---|---|---|---|
| 4,638,187 | 1/1987 | Boler et al. | 326/27 |
| 4,825,101 | 4/1989 | Walters, Jr. | 326/27 |
| 4,987,324 | 1/1991 | Wong et al. | 326/27 |
| 5,111,064 | 5/1992 | Ward | 327/379 |
| 5,410,262 | 4/1995 | Kang | 327/170 |
| 5,483,188 | 1/1996 | Frodsham | 327/170 |
| 5,512,854 | 4/1996 | Park | 327/108 |

*Primary Examiner*—Toan Tran
*Attorney, Agent, or Firm*—Westman, Champlin & Kelly, P.A.

[57] ABSTRACT

An open drain driver circuit includes first and second NMOS driver transistors, a delay circuit, an OR gate and an AND gate. Each NMOS driver transistor has a drain coupled to an output terminal, a source coupled to a supply terminal, and a gate. The delay circuit has an input coupled to the input terminal and has an output. The OR gate has a first input coupled to the input terminal, a second input coupled to the output of the delay circuit and an output coupled to the gate of the first NMOS transistor. The AND gate has a first input coupled to the input terminal, a second input coupled to the output of the delay circuit and an output coupled to the gate of the second NMOS transistor.

12 Claims, 4 Drawing Sheets

OPEN DRAIN OUTPUT DRIVER HAVING DIGITAL SLEW RATE CONTROL

BACKGROUND OF THE INVENTION

The present invention relates to an output driver for an integrated circuit and, more particularly, to an open drain output driver having digital slew rate control.

Integrated circuits, such as application specific integrated circuits (ASICs) include output drivers for driving signals off-chip over one or more transmission lines. A basic output driver has very fast rise and fall characteristics which can cause reflection and ringing in the transmission line that is coupled to the output. Output drivers have therefore been modified to limit transient currents in the output by slowing the rate of change of current drawn by the output driver over time.

There are several types of output driver circuits. Open drain output drivers include one or more NMOS driver transistors having a drain coupled to the output terminal, a source coupled to ground and a gate coupled to a control circuit. The control circuit turns the NMOS driver transistors on and off as a function of an input signal. An off-chip termination resistor is typically coupled between the transmission line and a relatively positive supply terminal. The termination resistor pulls the transmission line high when the NMOS driver transistors are off. Open drain output drivers have been implemented in technology such as gunning transistor logic (GTL) and NMOS transistor logic (NTL).

Traditional methods for slew rate control in open drain output drivers include analog feedback and linear digital delay circuits. Analog feedback methods have had difficulties in transmission line environments where the initial step voltage applied to the output causes the feedback to transition too early. In a linear digital delay circuit, the gates of the NMOS driver transistors are controlled by respective nodes in a delay line. The delay line causes the NMOS driver transistors to turn on and turn off in a selected order which results in a stepped increase or decrease in the current drawn from the delay line. Slew rate is controlled by selecting the delay between each node in the delay line and the gate widths of the different NMOS driver transistors.

A primary difficulty with traditional linear digital delay circuits is an inconsistency in the design criteria for controlling the turn-on and turn-off slew rates. The drain current of each NMOS driver transistor is proportional to the drain-to-source voltage and the gate width. The drain-to-source voltage is initially small when the transistors are switched from an on state to an off state and is initially large when the transistors are switched from the off state to the on state. Therefore, it is preferred to turn off the NMOS driver transistor having the largest gate width first and turn off the NMOS driver transistor having the smallest gate width last. In contrast, it is preferred to turn on the NMOS driver transistor having the smallest gate width first and turn on the NMOS driver transistor having the largest gate width last. Since the switching order in traditional open drain driver circuits is the same for the on and off transitions, the typical solution is to use a non-optimal switching order which achieves a compromise in the turn-on and turn-off slew rate controls.

SUMMARY OF THE INVENTION

The open drain driver circuit of the present invention includes first and second NMOS driver transistors, a delay circuit, an OR gate and an AND gate. Each NMOS driver transistor has a drain coupled to an output terminal, a source coupled to a supply terminal, and a gate. The delay circuit has an input coupled to the input terminal and has an output. The OR gate has a first input coupled to the input terminal, a second input coupled to the output of the delay circuit and an output coupled to the gate of the first NMOS transistor. The AND gate has a first input coupled to the input terminal, a second input coupled to the output of the delay circuit and an output coupled to the gate of the second NMOS transistor.

In one embodiment, the open drain driver circuit includes m NMOS driver transistors having different gate widths, where m is an even integer. The delay circuit includes a series on m–1 delay elements which are coupled in series with the input terminal and define m switch control nodes. In this embodiment, there are m/2 OR gates and m/2 AND gates. The first input of each OR gate is coupled to the first input of a respective AND gate and to a respective switch control node. The second input of each OR gate is coupled to the second input of a respective AND gate and to a respective switch control node. The outputs of each OR and AND gate are coupled to the gates of respective ones of the m NMOS driver transistors.

The OR and AND gates ensure that the m NMOS driver transistors turn on sequentially in a first order, from smallest to largest gate width, and turn off sequentially in a reverse order, from largest to smallest gate width. The open drain driver circuit of the present invention therefore provides optimum slew rate control for both rising and falling transitions.

DETAILED DESCRIPTION OF THE PREFERRED EMBODIMENTS

The open drain driver circuit of the present invention achieves optimum turn on and turn off slew rate control by turning on the NMOS driver transistors sequentially in a first order and turning off the NMOS driver transistors sequentially in a second order, which is preferably reverse of the first order. In contrast, the switching order within open drain driver circuits of the prior art have traditionally been fixed.

Figure 1:
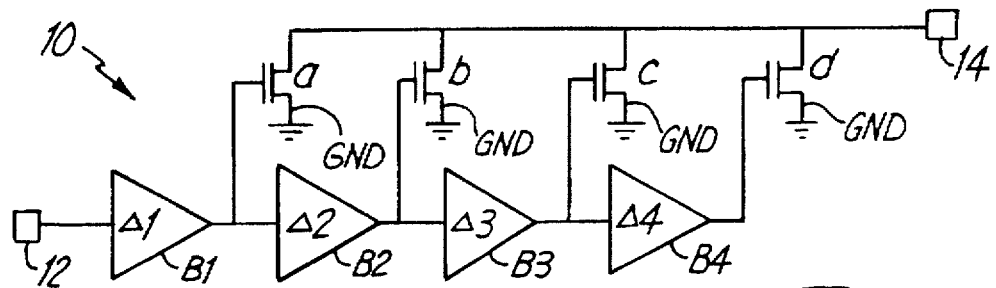
FIG. 1 is a schematic diagram of a typical open drain driver circuit of the prior art.

FIG. 1 is a schematic diagram of a typical open drain driver circuit of the prior art. Driver circuit 10 includes input terminal 12, output terminal 14, NMOS driver transistors a, b, c and d and a liner digital delay line formed by buffers B1, B2, B3 and B4. NMOS driver transistors a–d each have a drain coupled to output terminal 14, a source coupled to ground terminal GND and a gate coupled to a respective node in the delay line formed by buffers B1–B4. Buffers B1–B4 each have a delay Δ1–Δ4, respectively, between its input and its output. Output terminal 14 is coupled to an off-chip transmission line (not shown), which is tied to a relatively positive supply terminal through a termination resistor.

A low to high transition on input terminal 12 causes the driver transistors to turn on sequentially in the order a, b, c and then d, which incrementally pulls output terminal 14 low toward ground terminal GND. Likewise, a high to low transition on input terminal 12 causes the driver transistors to turn off in the order a, b, c and then d, which incrementally allows the termination resistor (not shown) to pull the voltage on output terminal 14 high. NMOS driver transistors a, b, c and d have gate widths $W_a$, $W_b$, $W_c$ and $W_d$, respectively, which are selected along with delays Δ1–Δ4 to achieve a desired slew rate control.

With NTL technology, the voltage swing across the drain and source of each driver transistor is only 1.5–0.4 volts. With GTL technology, the voltage swing across the drain and source of each driver transistor is only 1.2 to 0.2 volts. The gate, however, receives substantially the full voltage swing VDD between the supply rails. Therefore, the driver transistors are in the linear region when on. In the linear region, $$I_D = \frac{K}{2} [2(V_{GS} - V_T)V_{DS} - V_{DS}^2]$$  Eq. 1 where $V_{GS} \geq V_T$ and $V_{DS} \leq V_{GS} - V_T$

In Equation 1, $I_D$ is the drain current, K is the device transconductance parameter, $V_{GS}$ is the gate to source voltage, $V_T$ is the device threshold of voltage and $V_{DS}$ is the drain to source voltage. The device transconductance parameter K is defined K=K'(W/L), where W is the gate width, L is gate length and K' is the process transconductance parameter, which is defined the well-know relation, $$K' = \frac{\mu_n C_{ox}}{2}$$  Eq. 2 where μn is the electron mobility and $C_{ox}$ is the gate oxide capacitance per unit area. Making the substitutions for K and $V_{GS}$, $$I_D = \frac{K'}{2} \frac{W}{L} [2(VDD - V_T)V_{DS} - V_{DS}^2]$$  Eq. 3

The drain current $I_D$ is therefore proportional to the gate width W and the drain to source voltage $V_{DS}$. When turning the NMOS driver transistors from on to off, the drain to source voltage, $V_{DS}$ is initially small. To limit the rate of change of the drain current $I_D$ over time, it is preferable to turn off the NMOS driver transistor having the largest gate width first and the NMOS driver transistor having the smallest gate width last. In contrast, when turning the NMOS driver transistors from off to on, the drain to source voltage $V_{DS}$ is initially large, and it is preferable to turn on the NMOS driver transistor having the smallest gate width first and the NMOS driver transistor having the largest gate width last. However, the switching order of NMOS driver transistors a–d is fixed.

A typical solution for the circuit shown in FIG. 1 is to arrange the gate widths $W_a$–$W_d$ of transistors a–d in a less than optimal order that partially achieves both goals. For example, transistors a–d may have relative gate widths of $W_a$=1, $W_b$=3, $W_c$=5 and $W_d$=1. Another difficulty with the driver circuit shown in FIG. 1 is that it tends to scale poorly across corners in process variation curves.

Figure 2:
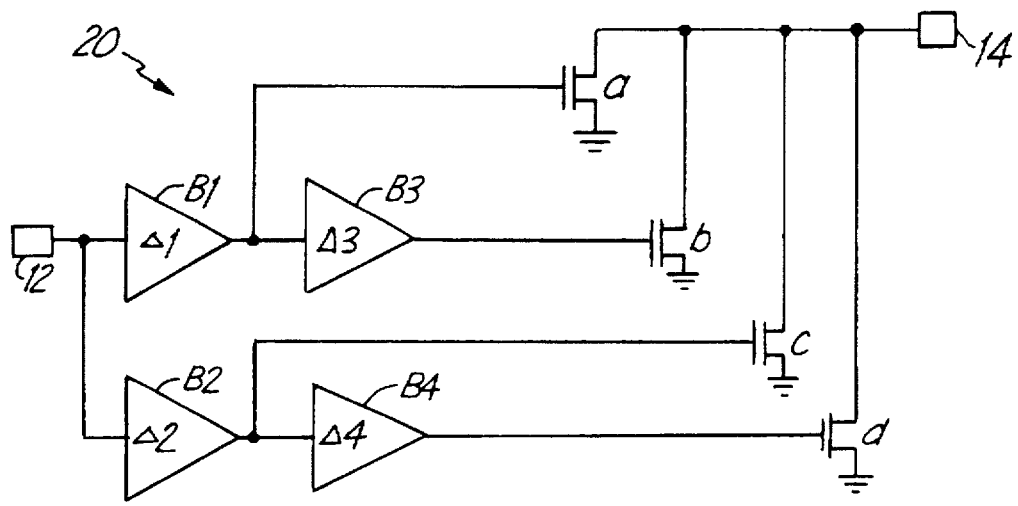
FIG. 2 is a schematic diagram of an alternative open drain driver circuit having a fixed switching order.

FIG. 2 is a schematic diagram of a modification of the open drain driver circuit shown in FIG. 1. The same reference numerals are used in FIG. 2 and in subsequent figures for the same or similar or components. Driver circuit 20 is similar to driver circuit 10, but the delay line is divided into two parallel delay lines, with each delay line driving a pair of NMOS driver transistors a–b and c–d. The delays of buffers B1–B4 are selected such that Δ2>Δ1 and Δ3≈Δ4. Circuit 20 has a smaller granularity in the switching delays than does the circuit shown in FIG. 1 and has improved scaling over process variation corners. However, this circuit still does not solve the difficulty in ordering the gate widths for optimum turn on and turn off slew rate control since the switching order is fixed.

Figure 3:
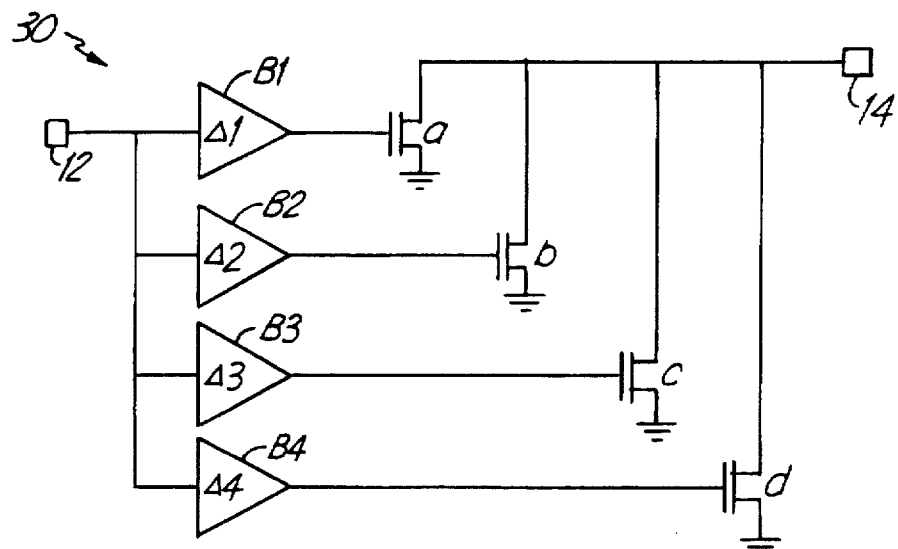
FIG. 3 is a schematic diagram of yet another open drain driver circuit having a fixed switching order.

FIG. 3 is a schematic diagram of yet another open drain driver circuit having a fixed switching order. In driver circuit 30, buffers B1–B4 are essentially coupled in parallel with one another and the delays Δ1–Δ4 are selected to achieve a desired switching order of NMOS driver transistors a–d.

If the rise and fall delays of buffers B1–B4 were adjusted separately in an attempt to vary the turn-on switching order with respect to the turn-off switching order, several substantial difficulties arise. Each buffer B1–B4 is typically implemented with a pair CMOS inverters. The rise and fall delays of buffer B1 can be varied with respect to one another by adjusting the ratio between the gate widths of the PMOS and NMOS transistors within the buffer. In order to change the turn-on order and the turn-off order, Δ1 (rise) must be much smaller than Δ1 (fall). For example, if NMOS driver transistor a has a large gate width, then it has a large gate capacitance and requires an impractically large ratio between the gate widths of the PMOS and NMOS transistors in buffer B1 in order to achieve the desired difference in Δ1 (rise) and Δ1 (fall). Also, it is difficult to obtain a large difference in the delays between buffers B1 and B4. A large delay requires a very slow rise or fall transition. A very slow rise or fall transition in one of the buffers causes problems at high data frequencies.

Figure 4:
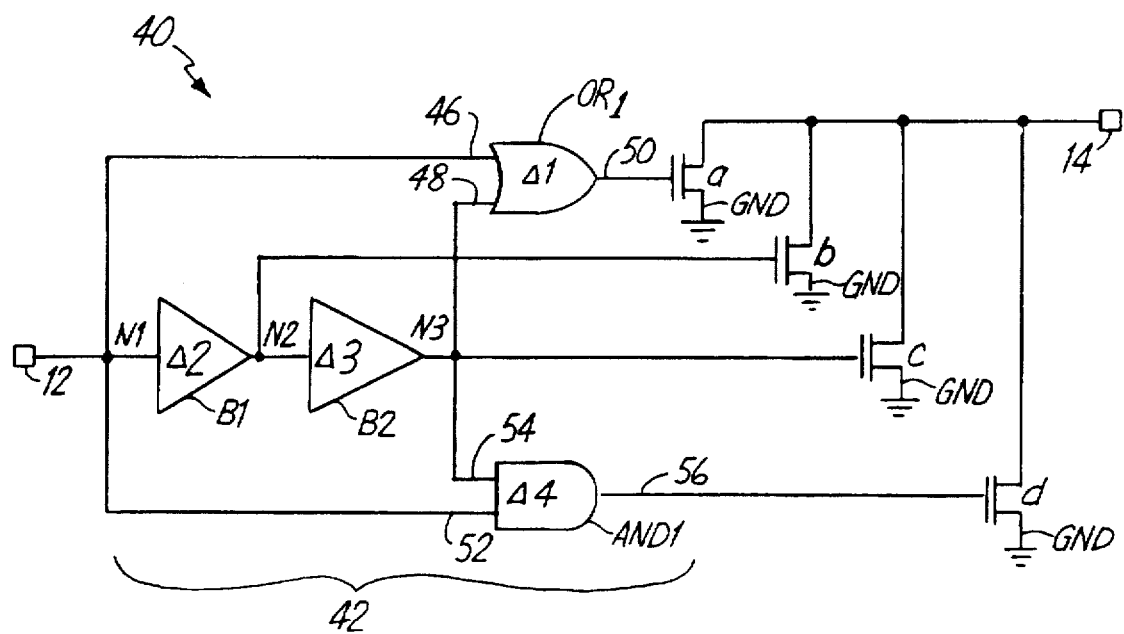
FIG. 4 is a schematic diagram of an open drain driver circuit according to the present invention.

FIG. 4 is a schematic diagram of an open drain driver circuit according to one embodiment of the present invention. Driver circuit 40 includes open drain NMOS driver transistors a, b, c and d and switch control circuit 42. Transistors a, b, c and d each have a drain coupled to output terminal 14, a source coupled to ground terminal GND and a gate coupled to a respective output of switch control circuit 42. In addition, transistors a–d have gate widths $W_a$, $W_b$, $W_c$ and $W_d$. In a preferred embodiment, $W_d$ is the largest gate width and $W_a$ is the smallest gate width.

Switch control circuit 42 includes OR gate OR1, AND gate AND1 and a delay circuit formed by buffers B1 and B2. Buffers B1 and B2 are coupled in series with input terminal 12. The input of buffer B1 is coupled to input terminal 12 and defines switch control node N1. The output of buffer 1 is coupled to the input of buffer B2 and defines switch control node N2. The output of buffer B2 defines switch control node N3. OR gate OR1 has an input 46 which is coupled to switch control node N1, an input 48 which is coupled to switch control node N3, and an output 50 which is coupled to the gate of transistor a. AND gate AND1 has an input 52 which is coupled to switch control node N1, an input 54 which is coupled to switch control input N3, and an output 56 which is coupled to the gate of transistor d. The gate of transistor b is coupled to switch control node N2 and the gate of transistor c is coupled to switch control node N3. OR gate OR1 has a delay Δ1, buffer B1 has a delay Δ2, buffer B2 has a delay Δ3 and AND gate AND1 has a delay Δ4. In the embodiment shown in FIG. 4, Δ2 >Δ1 and Δ4.

When the voltage on input terminal 12 rises from a logic low level to a logic high level, the switching order of the NMOS driver transistors is a, b, c and then d. As voltage on input terminal 12 rises, the voltage on input 46 of OR gate OR1 rises, which causes output 50 to rise and turn on transistor a. Next, the output of buffer B1 rises at switch control node N2 which turns on transistor b. Next, the output of buffer B2 rises at node N3 which turns on transistor c. Finally, with both inputs 52 and 54 at a logic high level, output 56 of AND1 rises which turns transistor d.

When the voltage on input terminal 12 falls from a logic high level to a logic low level, the switching order of NMOS driver transistors a and d reverses. The switching order of transistors b and c remains fixed. As the voltage on input terminal 12 and thus input 52 of AND1 falls, output 56 falls which turns off transistor d. Next, the output of buffer B1 falls which turns off transistor b. Next, the output of buffer B2 falls which turns off transistor c. Finally, with both inputs 46 and 48 of OR1 low, output 50 goes low which turns off transistor a.

By reversing the switching order of transistors a and d, driver circuit 40 allows for a more optimal slew rate control if transistor d has the largest gate width and transistor a has the smallest gate width. Driver circuit 40 requires only two more transistors than the circuits shown in FIGS. 1–3.

The embodiment shown in FIG. 4 can be modified to include only three NMOS driver transistors a, c and d by removing transistor b and buffer B1. The embodiment shown in FIG. 4 can be further modified to include only two NMOS driver transistors a and d by further removing transistor c and the connection between the gate of transistor c and switch control node N3.

Figure 5:
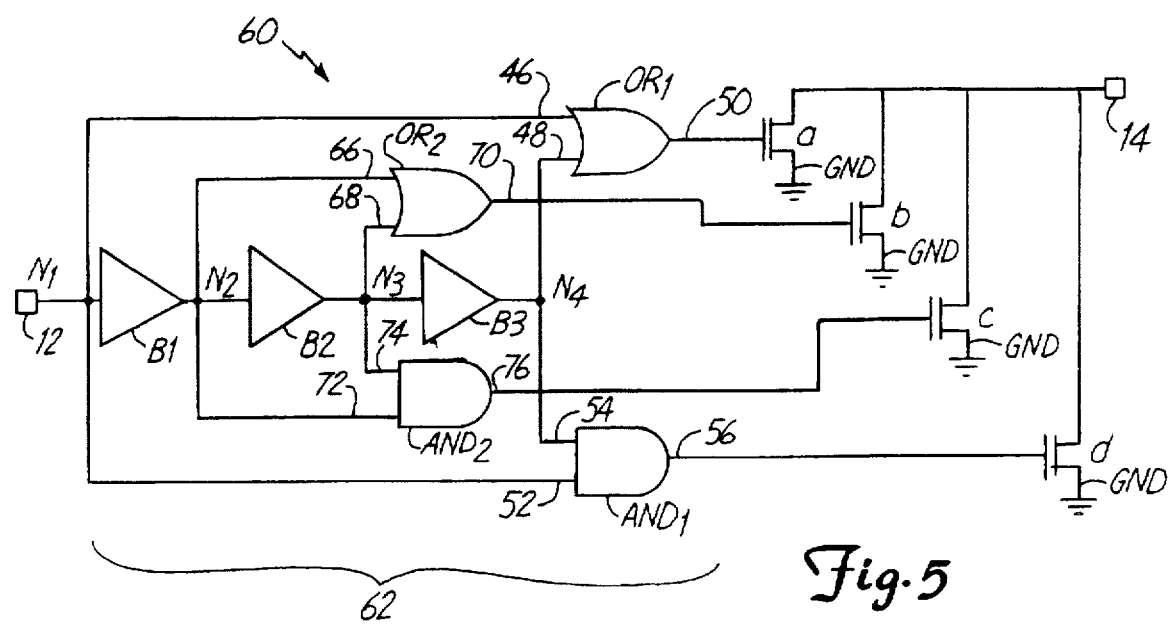
FIG. 5 is a schematic diagram of an open drain driver circuit according to an alternative embodiment of the present invention.

FIG. 5 is a schematic diagram of an open drain driver circuit 60 according to an alternative embodiment of the present invention. Driver circuit 60 is similar to driver circuit 40 shown in FIG. 4 and includes NMOS driver transistors a–d and switch control circuit 62. However, switch control circuit 62 further includes buffer B3, OR gate OR2 and AND gate AND2 which cause the switching order of transistors b and c to reverse with the switching order of transistors a and d.

Buffer B3 is coupled between switch control node N3 and switch control node N4. Inputs 48 and 54 of OR1 and AND1 are now coupled to switch control node N4. OR2 has an input 66 coupled to switch control node N2, an input 68 coupled to switch control node N3 and an output 70 coupled to the gate of transistor b. AND2 has an input 72 coupled to switch control node N2, an input 74 coupled to switch control node N3 and an output 76 coupled to the gate of transistor c. OR2 and AND2 operate in a similar manner as OR1 and AND1 and insure that transistors b and c turn off in an order that is reverse from the order in which they turn on. The overall turn-on switching order of transistors a–d is therefore a, b, c and then d, and the overall turn-off switching order is d, c, b and then a. This allows for optimum slew rate control for both the rise and fall characteristics if $W_D > W_C > W_B > W_A$.

Figure 6:
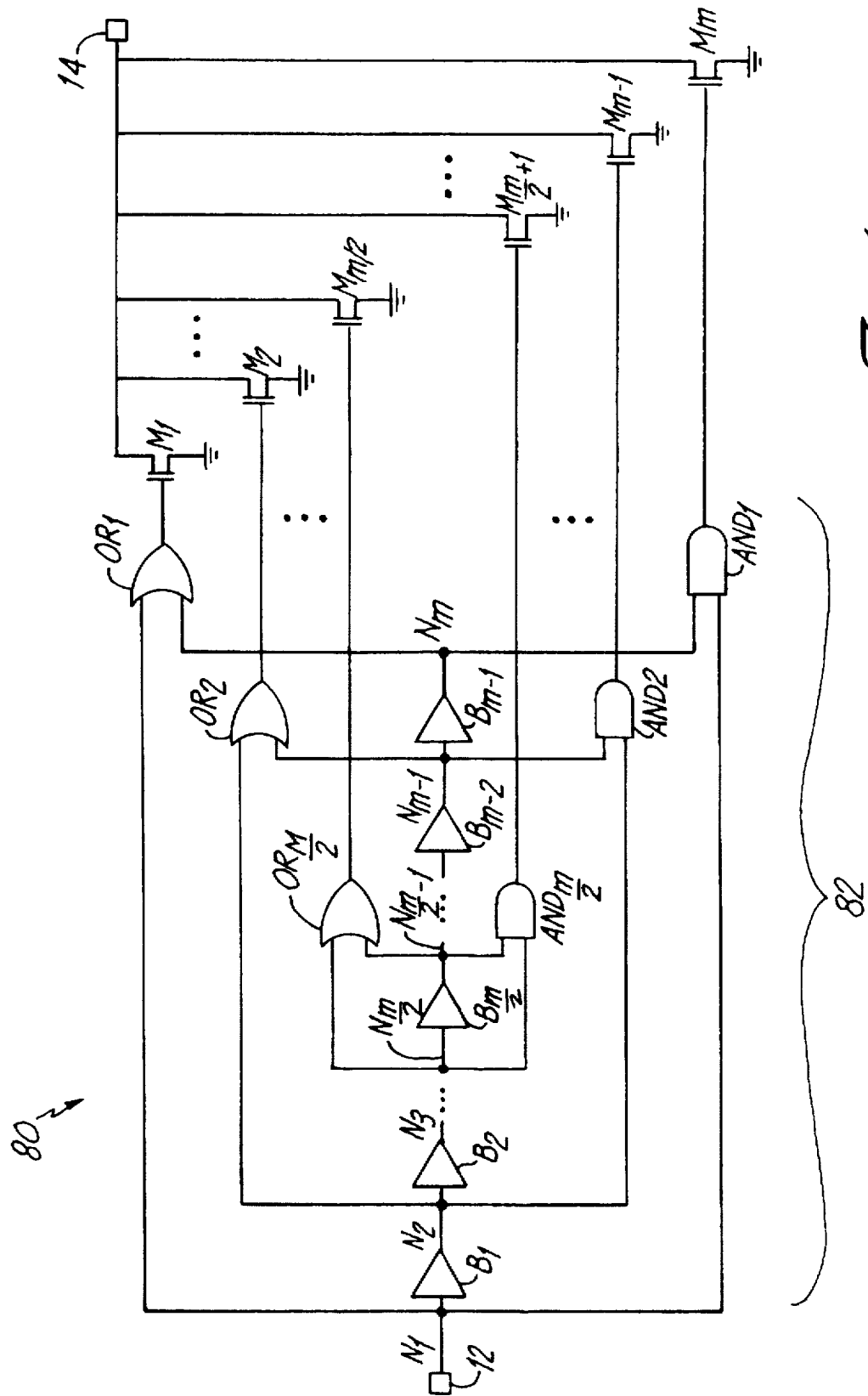
FIG. 6 is a schematic diagram of an open drain driver circuit illustrating expansion of the circuit to various numbers of driver transistors.

FIG. 6 is a schematic diagram of an open drain driver circuit which illustrates how the embodiment of FIG. 5 can be expanded or contracted to include any even integer of NMOS driver transistors. Driver circuit 80 includes m NMOS driver transistors $M_1$–$M_m$, where m is an even integer. Switch control circuit 82 includes a delay line formed by m–1 buffers $B_1$–$B_{m-1}$ which are coupled together in series to define m switch control nodes $N_1$–$N_m$. Switch control circuit 82 further includes m/2 OR gates $OR_1$–$OR_{m/2}$ and m/2 AND gates $AND_1$–$AND_{m/2}$. The two inputs of each OR gate $OR_i$ are coupled as follows:

$$OR_i(N_i, N_{m+1-i})|_{i=1}^{m/2} \qquad \text{Eq. 4}$$

where, i is a variable ranging from 1 to m/2, $OR_i$ is the $i^{th}$ OR gate, and $N_i$ and $N_{m+1-i}$ are the nodes to which the first and second inputs of $OR_i$ are connected, respectively.

Similarly, the two inputs of each AND gate $AND_i$ are coupled as follows:

$$AND_i(N_i, N_{m+1-i})|_{i=1}^{m/2} \qquad \text{Eq. 5}$$

where $AND_i$ is the $i^{th}$ AND gate and $N_i$ and $N_{m+1-i}$ are the nodes to which the first and second inputs of $AND_i$ are connected, respectively.

Figure 7:
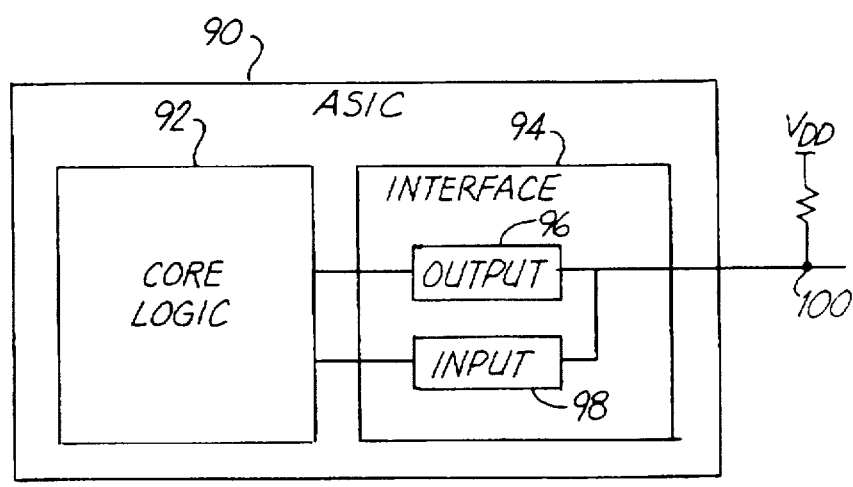
FIG. 7 is a block diagram of an application specific integrated circuit (ASIC) in which the present invention is useful.

The open drain driver circuit of the present invention is useful in a variety of integrated circuit applications, such as in an application specific integrated circuit (ASIC). FIG. 7 is a block diagram of an ASIC incorporating the present invention. ASIC 90 includes core logic 92 and interface circuit 94. Interface circuit 94 includes output driver circuit 96 and input circuit 98 which allow core logic 92 to transmit and receive data over transmission line 100. The open drain driver circuit of the present invention is incorporated within output driver circuit 96. An off-chip termination resistor R is coupled between transmission line 100 and supply terminal VDD. Termination resistor R provides impedance matching and provides a pull-up voltage on transmission line 100 when the open drain NMOS driver transistors within output driver circuit 96 are off. Termination resistor R may have a resistance of 25 or 50 Ohms, for example.

Although the present invention has been described with reference to preferred embodiments, workers skilled in the art will recognize that changes may be made in form and detail without departing from the spirit and scope of the invention. For example, the present invention can be modified to implement an open source PMOS driver circuit, rather than an open drain NMOS driver circuit. In addition the present invention can be implemented with technology other than MOS, such as with bi-polar junction transistors. Individual signals in the driver circuit of the present invention can be active high or low, and corresponding circuitry can be converted to suit a particular convention. The term "coupled" used in the specification and in the claims includes various types of connections or couplings and includes a direct connection or a connection through one or more intermediate components.

What is claimed is:

1. An open drain driver circuit comprising:
   an input terminal and an output terminal;
   a supply terminal;
   first and second NMOS driver transistors, each transistor having a drain coupled to the output terminal, a source coupled to the supply terminal, and a gate;
   a delay circuit having an input coupled to the input terminal and having an output;
   a first OR gate having first and second inputs and an output, wherein the first input of the first OR gate is coupled to the input terminal, the second input of the first OR gate is coupled to the output of the delay circuit and the output of the first OR gate is coupled to the gate of the first NMOS transistor; and
   a first AND gate having first and second inputs and an output, wherein the first input of the first AND gate is coupled to the input terminal, the second input of the first AND gate is coupled to the output of the delay circuit and the output of the first AND gate is coupled to the gate of the second NMOS transistor.

2. The open drain driver circuit of claim 1 wherein the first NMOS driver transistor has a gate width which is smaller than the gate width of the second NMOS driver transistor.

3. The open drain driver circuit of claim 1 and further comprising:
   a third NMOS driver transistor having a drain coupled to the output terminal, a source coupled to the supply terminal, and a gate coupled to the output of the delay circuit.

4. The open drain driver circuit of claim 3 wherein the delay circuit has a delay between its input and its output which is greater than the delay between the inputs and outputs of the first OR and AND gates.

5. The open drain driver circuit of claim 1 and further comprising:
   third and fourth NMOS driver transistors, each having a drain coupled to the output terminal, a source coupled to the supply terminal, and a gate; and
   wherein the delay circuit comprises a first buffer having an input coupled to the input terminal and an output coupled to the gate of the third NMOS driver transistor, and a second buffer having an input coupled to the output of the first buffer and an output coupled to the gate of the fourth NMOS driver transistor and to the second inputs of the first OR and AND gates.

6. The open drain driver circuit of claim 1 and further comprising:
   third and fourth NMOS driver transistors having a drain coupled to the output terminal, a source coupled to the supply terminal, and a gate;
   a second OR gate having first and second inputs and an output, wherein the output of the second OR gate is coupled to the gate of the third NMOS transistor;
   a second AND gate having first and second inputs and an output, wherein the output of the second AND gate is coupled to the gate of the fourth NMOS transistor;
   wherein the delay circuit comprises first, second and third buffers coupled in series with one another, each buffer having an input and an output;
   wherein the first inputs of the first OR gate and the first AND gate are coupled to the input terminal and to the input of the first buffer and the second inputs of the first OR gate and the first AND gate are coupled to the output of the third buffer; and
   wherein the first inputs of the second OR gate and the second AND gate are coupled to the output of the first buffer and the second inputs of the second OR gate and the second AND gate are coupled to the output of the second buffer.

7. An open drain driver circuit comprising:
   an input terminal and an output terminal;
   a supply terminal;
   m NMOS driver transistors, each transistor having a drain coupled to the output terminal, a source coupled to the supply terminal, and a gate, wherein m is an even integer;
   a series of m−1 delay elements coupled to the input terminal and defining m switch control nodes;
   m/2 OR gates, each OR gate having first and second inputs and an output;
   m/2 AND gates, each AND gate having first and second inputs and an output; and
   wherein the first input of each OR gate is coupled to the first input of a respective AND gate and to a first respective switch control node, the second input of each OR gate is coupled to the second input of a respective AND gate and to a second respective switch control node, and the output of each OR and AND gate is coupled to the gate of a respective one of the m NMOS driver transistors.

8. An open drain driver circuit comprising:
   an input terminal and an output terminal;
   a supply terminal;
   a plurality of NMOS driver transistors $M_1$–$M_m$, wherein each transistor has a drain coupled to the output terminal, a source coupled to the supply terminal, and a gate, and wherein m is an even integer;
   a series delay buffers $B_1$–$B_{m-1}$ coupled to the input terminal and defining a plurality of switch control nodes $N_1$–$N_m$;
   OR gates $OR_i$ (for i=1 to i=m/2), wherein each OR gate $OR_i$ has a first input coupled to switch control node $N_i$ and a second input coupled to switch control node $N_{m+1-i}$, and wherein OR gates $OR_i$ (for i=1 to i=m/2) have outputs coupled to the gates of NMOS driver transistors $M_1$–$M_{m/2}$, respectively; and
   AND gates $AND_i$ (for i=1 to i=m/2), wherein each AND gate $AND_i$ has a first input coupled to switch control node $N_i$ and a second input coupled to switch control node $N_{m+1-i}$, and wherein AND gates $AND_i$ (for i=1 to i=m/2) have outputs coupled to the gates of NMOS driver transistors $M_m$–$M_{m/2+1}$, respectively.

9. The open drain driver circuit of claim 8 wherein NMOS driver transistors $M_1$–$M_m$ have gate widths $W_1$–$W_m$, respectively, and wherein $W_m > W_{m-1} > \ldots > W_2 > W_1$.

10. A method of independently controlling rising and falling slew rate at an output terminal which is driven by a plurality of open drain NMOS transistors, the method comprising:
    receiving an input control signal;
    generating a delayed control signal as a function of the input control signal;
    generating a first switch control signal as a function of a logical OR of the input control signal and the delayed control signal;
    generating a second switch control signal as a function of a logical AND of the input control signal and the delayed control signal;
    controlling a first of the plurality of open drain NMOS driver transistors as a function of the first switch control signal; and
    controlling a second of the plurality of open drain NMOS driver transistors as a function of the second switch control signal.

11. The method of claim 10 wherein the steps of controlling the first and second open drain NMOS driver transistors:
    turning on the first and second open drain NMOS transistors sequentially in a first order; and
    turning off the first and second open drain NMOS transistors sequentially in a second order, which is reverse of the first order.

12. An output driver circuit comprising:
    an input terminal for receiving an input control signal;
    an output terminal;
    a supply terminal;
    a plurality of driver transistors, each transistor having a first terminal coupled to the output terminal, a second terminal coupled to the supply terminal, and a control terminal;

delay means coupled to the input terminal for generating a delayed control signal as a function of the input control signal;

means for generating a first switch control signal on a first switch output as a function of a logical OR of the input control signal and the delayed control signal, wherein the first switch output is coupled to the control terminal of a first of the plurality of driver transistors; and means for generating a second switch control signal on a second switch output as a function of a logical AND of the input control signal and the delayed control signal, wherein the second switch output is coupled to the control terminal of a second of the plurality of driver transistors.

* * * * *